United States Patent
Tsuchiya et al.

(10) Patent No.: US 8,345,390 B2
(45) Date of Patent: *Jan. 1, 2013

(54) MAGNETORESISTIVE EFFECT ELEMENT IN CPP-TYPE STRUCTURE AND MAGNETIC DISK DEVICE

(75) Inventors: Yoshihiro Tsuchiya, Tokyo (JP); Shinji Hara, Tokyo (JP); Tsutomu Chou, Tokyo (JP); Hironobu Matsuzawa, Tokyo (JP)

(73) Assignee: TDK Corporation, Tokyo (JP)

( * ) Notice: Subject to any disclaimer, the term of this patent is extended or adjusted under 35 U.S.C. 154(b) by 981 days.

This patent is subject to a terminal disclaimer.

(21) Appl. No.: 12/379,625

(22) Filed: Feb. 26, 2009

(65) Prior Publication Data

US 2010/0214701 A1 Aug. 26, 2010

(51) Int. Cl.
*G11B 5/39* (2006.01)

(52) U.S. Cl. .................. 360/324.2; 360/324; 360/324.1; 360/324.12; 428/811.1; 428/815; 365/158; 365/171; 257/421; 257/425; 29/603.01

(58) Field of Classification Search .................. None
See application file for complete search history.

(56) References Cited

U.S. PATENT DOCUMENTS

| | | | |
|---|---|---|---|
| 6,724,583 B2 | 4/2004 | Seigler | |
| 7,782,575 B2 * | 8/2010 | Tsuchiya et al. | 360/324.1 |
| 7,826,180 B2 * | 11/2010 | Tsuchiya et al. | 360/324.1 |
| 7,881,021 B2 * | 2/2011 | Chou et al. | 360/324 |
| 7,881,023 B2 * | 2/2011 | Machita et al. | 360/324.12 |
| 7,881,025 B2 * | 2/2011 | Shimazawa et al. | 360/324.2 |
| 7,974,048 B2 * | 7/2011 | Shimazawa et al. | 360/319 |
| 8,014,108 B2 * | 9/2011 | Shimazawa et al. | 360/319 |
| 8,029,853 B2 * | 10/2011 | Matsuzawa et al. | 427/128 |
| 8,031,444 B2 * | 10/2011 | Chou et al. | 360/324.1 |
| 8,094,420 B2 * | 1/2012 | Ayukawa et al. | 360/324.12 |
| 2007/0154740 A1 * | 7/2007 | Yuasa et al. | 428/812 |
| 2008/0278864 A1 * | 11/2008 | Zhang et al. | 360/324.12 |
| 2009/0128965 A1 * | 5/2009 | Mizuno et al. | 360/324 |
| 2009/0174971 A1 * | 7/2009 | Tsuchiya et al. | 360/324.2 |
| 2010/0214701 A1 * | 8/2010 | Tsuchiya et al. | 360/324.12 |

FOREIGN PATENT DOCUMENTS

| | | |
|---|---|---|
| JP | A-2000-156530 | 6/2000 |
| JP | A-2004-71714 | 3/2004 |
| JP | A-2008-177271 | 7/2008 |

* cited by examiner

*Primary Examiner* — Kevin Bernatz
(74) *Attorney, Agent, or Firm* — Posz Law Group, PLC (57) ABSTRACT

An MR element according to the present invention has the superior effects that further improve an MR ratio because a structure of a spacer layer 40 is configured of a certain three-layer structure with certain materials, and at least one of a first ferromagnetic layer 30 and a second ferromagnetic layer 50 contains a certain amount of an element selected from the group of nitrogen (N), carbon (C), and oxygen (O).

14 Claims, 4 Drawing Sheets

MAGNETORESISTIVE EFFECT ELEMENT IN CPP-TYPE STRUCTURE AND MAGNETIC DISK DEVICE

BACKGROUND OF THE INVENTION

1. Field of the Invention

The present invention relates to a magnetoresistive effect element in a current perpendicular to plane type (CPP-type) structure that detects a magnetic field intensity as a signal from a magnetic recording medium, and so on, a thin film magnetic head with the magnetoresistive effect element, and a head gimbal assembly and a magnetic disk device that have the thin film magnetic head.

2. Description of the Related Art

In recent years, with an increase in the longitudinal recording density of a magnetic disk device, there have been growing demands for improvements in the performance of a thin film magnetic head. For a thin film magnetic head, a composite type thin film magnetic head has been widely used; it has a structure where a reading head having a read-only magnetoresistive effect element (hereinafter often called the MR element for short), and a recording head having a write-only induction type electromagnetic conversion element are laminated together.

An MR element, for instance, includes an AMR element making use of an anisotropic magneto-resistive effect (AMR), a GMR element making use of the giant magneto-resistive effect (GMR), and a tunnel type magneto-resistive effect (TMR) element making use of the tunnel type magneto-resistive effect (TMR).

A reading head especially requires high sensitivity and high output characteristics. A GMR head with a GMR element in a spin valve type has already been mass-produced as a reading head capable of meeting these demands. Recently, a reading head with the TMR element has also been mass-produced for further improving the longitudinal recording density.

In view of the improvement of a SN ratio (signal-to-noise ratio), a next generation GMR element in a CPP-type structure (CPP-GMR element) is already being developed in which a sense current is applied in a perpendicular direction (laminated direction) to each layer surface formed for the GMR element.

A spin valve type CPP-GMR element includes a laminated structure having a conductive nonmagnetic intermediate layer, and a first ferromagnetic layer and a second ferromagnetic layer, which are separated by the conductive nonmagnetic intermediate layer. A typical spin valve type CPP-GMR element is formed by a laminated structure for its main layers as follows: a lower electrode/an antiferromagnetic layer/a first ferromagnetic layer/a nonmagnetic intermediate layer/a second ferromagnetic layer/an upper electrode. A magnetization direction of the first ferromagnetic layer, which is one of the ferromagnetic layers, is pinned in the perpendicular direction to a magnetization direction of the second ferromagnetic layer when the externally applied magnetic field is zero (0). The magnetization direction of the first ferromagnetic layer can be pinned by making an antiferromagnetic layer adjacent thereto and providing unidirection anisotropic energy (also referred to as "exchange bias" or "coupling magnetic field") to the first ferromagnetic layer by means of exchange-coupling between the antiferromagnetic layer and the first ferromagnetic layer. For this reason, the first ferromagnetic layer is also called a pinned layer. In this element, a smaller cross sectional area of an element has a larger resistance value. Namely, it is an appropriate structure for, so called, a narrower track that narrows a track width.

In order to have the recording density, 1 Tbits/in$^2$, as a next generation element, it is required that the size of an element is 25 nm×25 nm or smaller. In order to decrease the resistance of an element, it is required that the AR (Area Resistivity) of an MR element is 0.3Ω·μm$^2$ or lower.

To comply with these demands, in a CPP-type element, which has a nonmagnetic intermediate layer of a three-layer structure, Cu/ZnO/Cu, and is processed at a temperature of 250° C. or lower, it is disclosed that an appropriate area resistivity (AR) and high MR value are realized (Japanese laid-open patent publication number JP2008-91842). ZnO is generally known as an N-type semiconductor characteristic because of the existence of zinc as an interstitial atom and an electron emitted from an oxygen deficiency.

However, if the element characteristics for over 1 Tbits/in$^2$ recording density are considered, the requirement to improve an MR ratio is unlimited. Therefore, a proposal of new and original technology that achieves a further improved MR ratio is required.

With the consideration of the situation described above, the present invention is provided. The object of the present invention is to provide an MR element in a CPP-type structure that further improves an MR ratio.

SUMMARY OF THE INVENTION

In order to solve the above mentioned issues, the present invention relates to an MR element in a CPP-type structure that has a spacer layer, and a first ferromagnetic layer and a second ferromagnetic layer which are laminated to sandwich the spacer layer. A sense current is applied in a laminated direction. The spacer layer has a first nonmagnetic metal layer and a second nonmagnetic metal layer which are made of a nonmagnetic metal material, and a semiconductor oxide layer, which is formed between the first nonmagnetic metal layer and the second nonmagnetic metal layer. The semiconductor oxide layer is made of zinc oxide (ZnO). The first nonmagnetic metal layer and the second nonmagnetic metal layer are made of a metal selected from the group of Cu and Zn, respectively. At least one of the first ferromagnetic layer and the second ferromagnetic layer contains an element selected from the group of nitrogen (N), carbon (C), and oxygen (O).

In a preferred embodiment of the MR element according to the present invention, at least one of a first ferromagnetic layer and a second ferromagnetic layer contains 0.5-14.0 at % of nitrogen (N).

In a preferred embodiment of the MR element according to the present invention, at least one of a first ferromagnetic layer and a second ferromagnetic layer contains 0.5-7.0 at % of carbon (C).

In a preferred embodiment of the MR element according to the present invention, at least one of a first ferromagnetic layer and a second ferromagnetic layer contains 0.5-10.0 at % of oxygen (O).

In a preferred embodiment of the MR element according to the present invention, a semiconductor oxide layer is made of zinc oxide (ZnO), a first nonmagnetic metal layer is made of Cu, a second nonmagnetic metal layer is made of Zn, and the second nonmagnetic metal layer is formed on or above the first nonmagnetic metal layer.

In a preferred embodiment of the MR element according to the present invention, a first ferromagnetic layer and a second ferromagnetic layer are made of CoFe, and at least one of these layers contains an element selected from the group of nitrogen (N), carbon (C), and oxygen (O).

In a preferred embodiment of the MR element according to the present invention, magnetic layers, which abut a spacer layer and are a part of a first ferromagnetic layer and a second ferromagnetic layer, are made of CoFe, and at least one of the magnetic layers (CoFe) contains an element selected from the group of nitrogen (N), carbon (C), and oxygen (O).

In a preferred embodiment of the MR element according to the present invention, a first ferromagnetic layer is a magnetic pinned layer, and a second ferromagnetic layer is a free layer.

In a preferred embodiment of the MR element according to the present invention, a first ferromagnetic layer and a second ferromagnetic layer are free layers.

In a preferred embodiment of the MR element according to the present invention, a layer thickness of a first nonmagnetic metal layer is 0.1-1.2 nm, a layer thickness of a second nonmagnetic metal layer is 0.1-1.2 nm, and a layer thickness of a semiconductor oxide layer is 1.0-4.0 nm.

In a preferred embodiment of the MR element according to the present invention, the AR (Area Resistivity) of an MR element is $0.1$-$0.3 \Omega \cdot \mu m^2$.

A thin film magnetic head according to the present invention includes an opposite surface to a recording medium, the MR element described above, which is formed in the vicinity of an opposite surface to the recording medium and detects a signal magnetic field from the recording medium, and a pair of electrodes through which an electric current flows in a laminated direction of the MR element.

A head gimbal assembly according to the present invention includes the thin film magnetic head described above, a slider that is formed in an opposite location to a recording medium, and a suspension that elastically supports the slider.

A magnetic disk device according to the present invention includes the thin film magnetic head described above, a slider that is formed in an opposite location to a recording medium, and a positioning device that supports the slider and locates the position of the slider against the recording medium.

DETAILED DESCRIPTION OF THE INVENTION

A description according to one embodiment of the present invention is given below.

Figure 1:
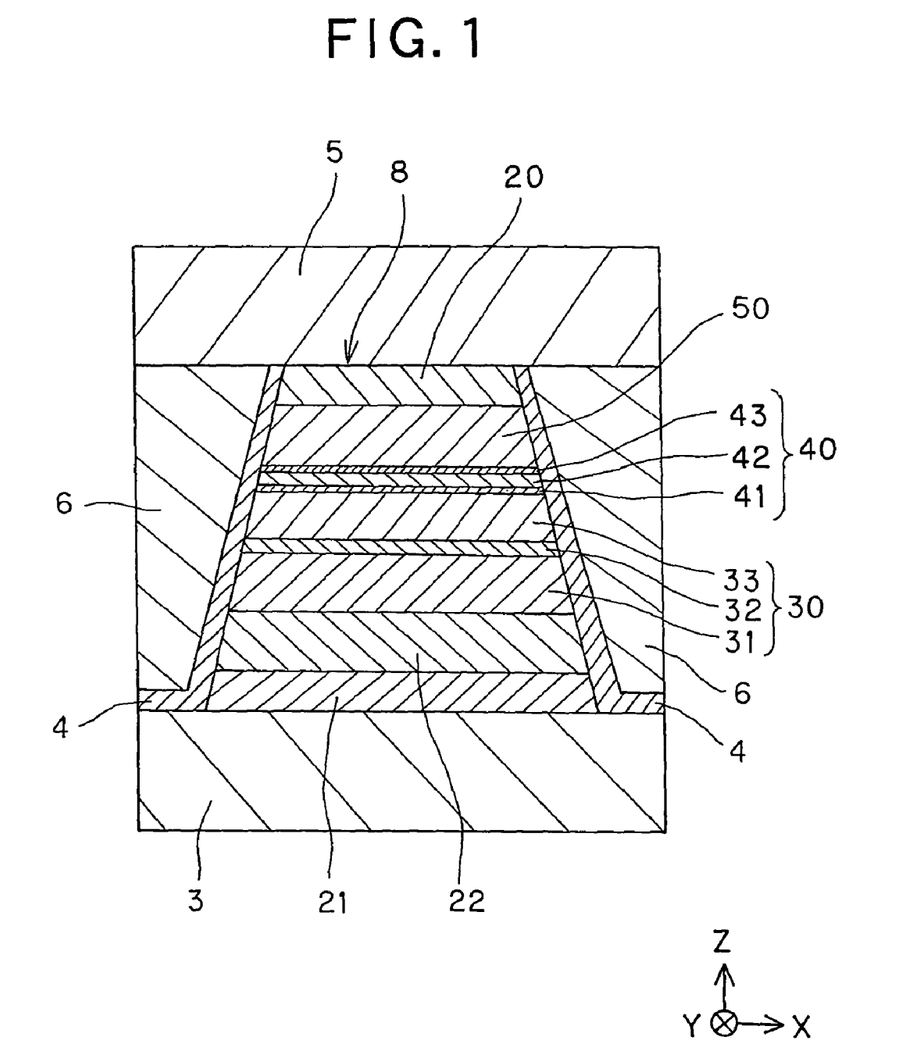
FIG. 1 is a sectional view of a reading head that is parallel to an opposite surface to a recording medium according to one embodiment of the present invention.

FIG. 1 is a schematic view of an air bearing surface (ABS) of a reading head according to one embodiment of the present invention, specifically, it shows the ABS of a giant MR element in a CPP-type structure (CPP-GMR element), which is a main part of the present invention. The ABS generally corresponds to a surface at which a reading head is in opposition to a recording medium (hereinafter often called the medium opposite surface), however, it is understood that the ABS of the present invention includes even a section at a position where a laminated structure of the element can be clearly observed. For instance, a passivation layer of diamond-like carbon (DLC) or the like (the passivation layer adapted to cover the element), in a strict sense, positioned facing the medium opposite surface may be omitted if necessary.

Figure 2:
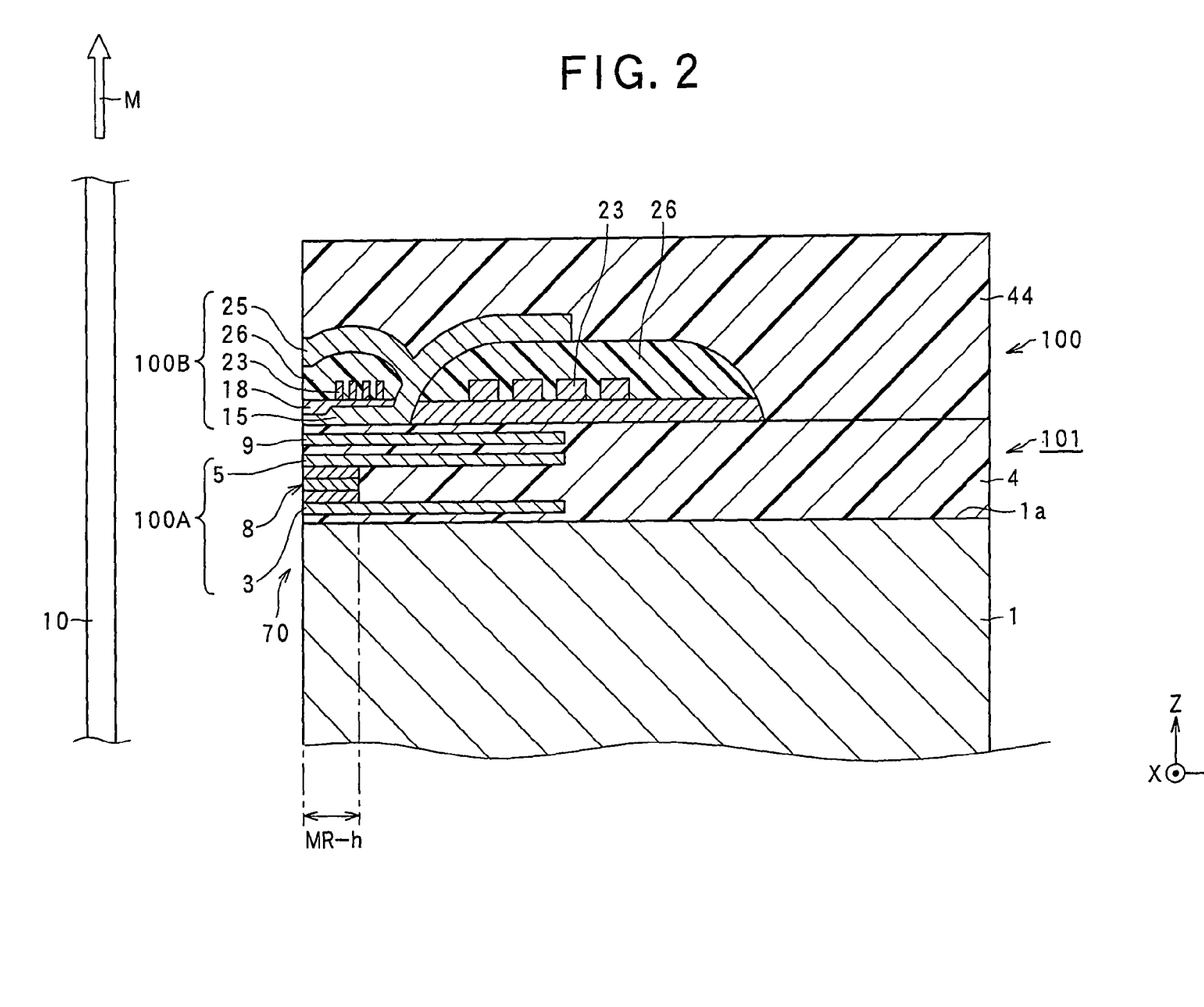
FIG. 2 is a sectional view of a thin film magnetic head that is perpendicular to an opposite surface to a recording medium and a substrate according to one embodiment of the present invention, and it is also for explaining the structure of the thin film magnetic device.
Figure 3:
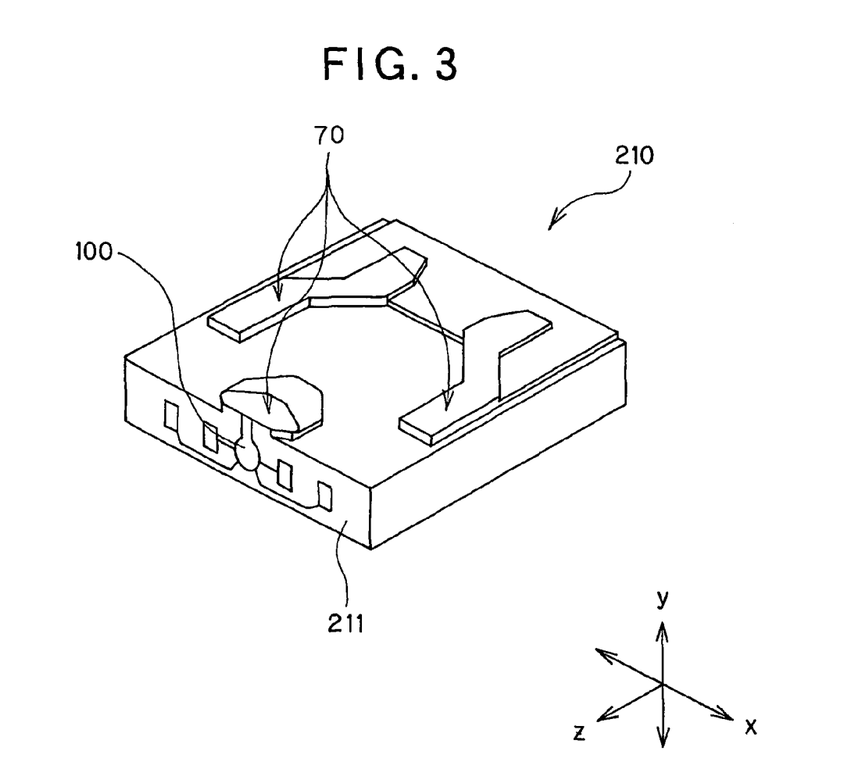
FIG. 3 is a perspective view of a slider that is a part of a head gimbal assembly according to one embodiment of the present invention.
Figure 4:
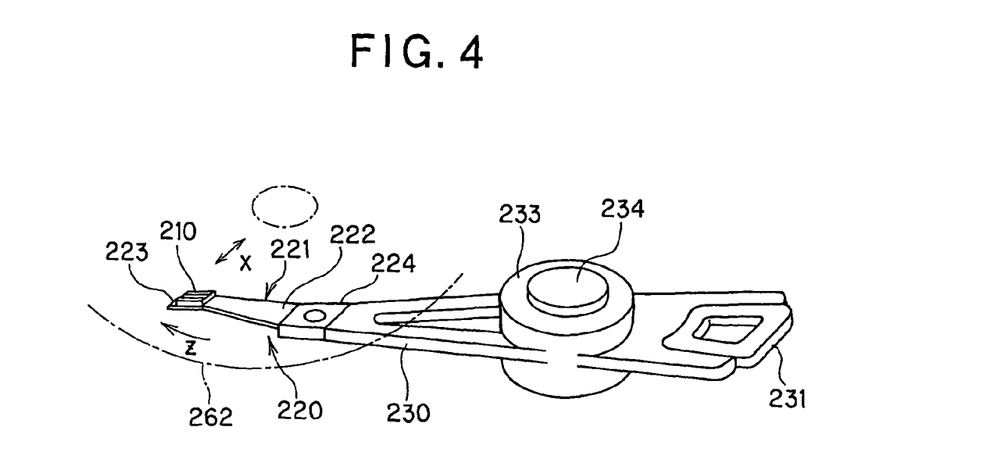
FIG. 4 is a perspective view of a head arm assembly that contains a head gimbal assembly according to one embodiment of the present invention.
Figure 5:
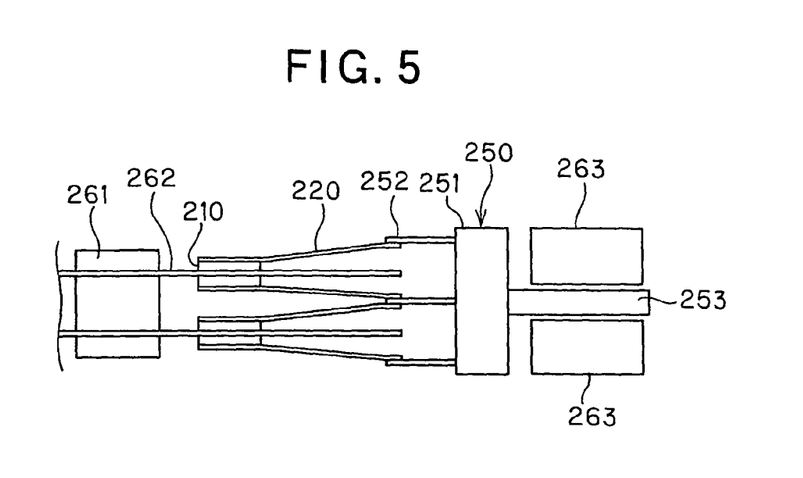
FIG. 5 is illustrative of a main part of a magnetic disk device according to one embodiment of the present invention.
Figure 6:
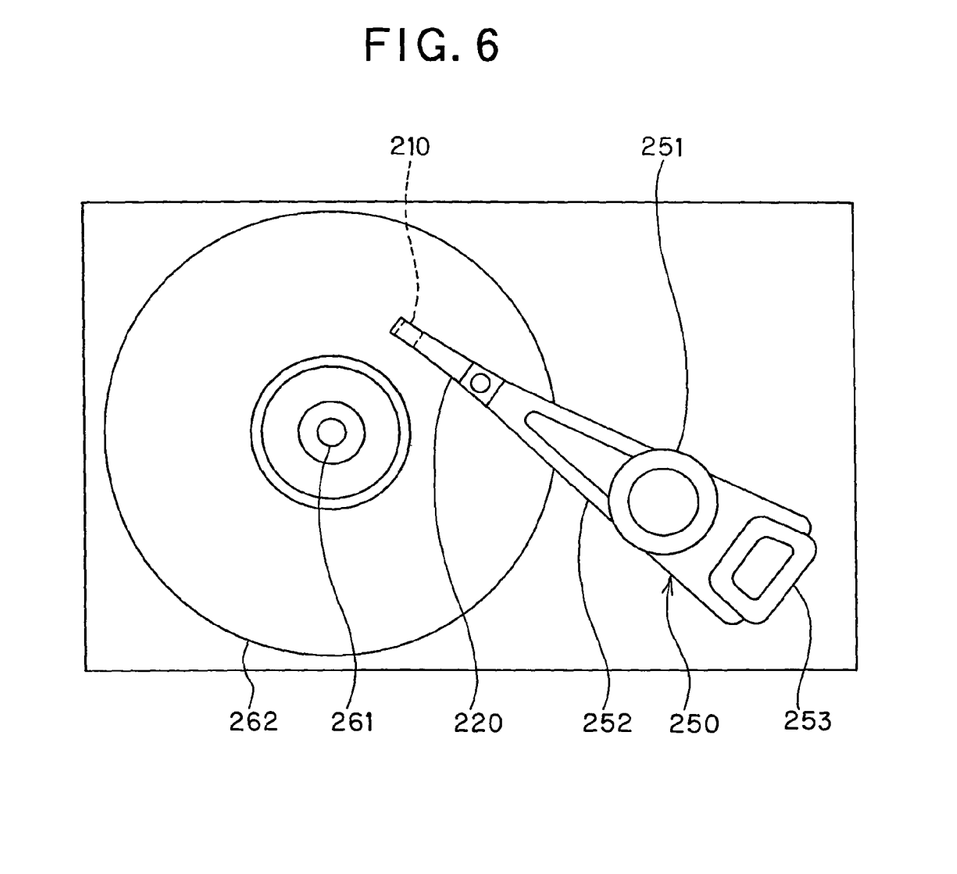
FIG. 6 is a top plan view of a magnetic disk device according to one embodiment of the present invention.

FIG. 2 is a sectional view of a thin film magnetic head that is perpendicular to an ABS and a substrate according to one embodiment of the present invention, and it is also for explaining the structure of the thin film magnetic head. FIG. 3 is a perspective view of a slider that is a part of a head gimbal assembly according to one embodiment of the present invention. FIG. 4 is a perspective view of a head arm assembly that contains a head gimbal assembly according to one embodiment of the present invention. FIG. 5 is illustrative of a main part of a magnetic disk device according to one embodiment of the present invention. FIG. 6 is a top plan view of a magnetic disk device according to one embodiment of the present invention.

In the explanation below, a size of the X axis is defined as "width," a size of the Y axis is defined as "length," and a size of the Z axis is defined as "thickness" in each drawing.

In the Y axis direction, an area that is close to an air bearing surface (a surface of a thin film magnetic head that is opposite to a recording medium; also called ABS) is defined as "front," and an area that is opposite side of the front is defined as "rear (or posterior)." The laminated up direction of an element is defined as "above" or "upper side," and the opposite direction is defined as "below" or "lower side."

[Giant MR Element in CPP-Type Structure (CPP-GMR Element)]

A detailed description of a structure of a reading head of a giant MR element in a CPP-type structure (CPP-GMR element) according to the present invention is given below with reference to FIG. 1.

As described above, FIG. 1 is a sectional view corresponding to a section of a reading head parallel to a medium opposite surface.

As shown in FIG. 1, the reading head according to the present embodiment includes a first shield layer 3 and a second shield layer 5 that are located at a given space and opposed vertically on the sheet, a giant MR element 8 (hereinafter referred simply to as the "GMR element 8") interposed between the first shield layer 3 and the second shield layer 5, an insulating film 4 adapted to cover two sides of the GMR element 8 and a part of the upper surface of the first shield layer 3 along those sides, and two bias magnetic field application layers 6 adjacent to the two sides of the GMR element 8 through the insulating film 4.

In this embodiment, the first shield layer 3 and the second shield layer 5 take a so-called magnetic shield role and a role of a pair of electrodes. In other words, they have not only a function of shielding magnetism but also a function of a pair of electrodes provided to enable a sense current to flow in a direction intersecting the plane of each of the layers forming the GMR element 8, for instance, in a direction perpendicular to the plane of each of the layers forming the GMR element 8 (laminated direction).

In addition to the first shield layer 3 and the second shield layer 5, another pair of electrodes may be provided above and below the GMR element 8.

A reading head according to the present invention has the GMR element 8 in a CPP-type structure.

As an easily understandable explanation for the concept of a structure of the GMR element 8 in CPP-type structure according to the present invention shown in FIG. 1, it has a spacer layer 40, and a first ferromagnetic layer 30 and a second ferromagnetic layer 50, which are laminated to sandwich the spacer layer 40. As a sense current is applied in a laminated direction of the GMR element 8, it causes the element to perform its own function. In other words, it is the GMR element 8 in the CPP-type structure.

In the embodiment shown in FIG. 1, the first ferromagnetic layer 30 functions as a so-called magnetic pinned layer 30, and the second ferromagnetic layer 50 functions as a so-called free layer 50.

The free layer 50 is a layer that a magnetization direction is changed according to an external magnetic field, i.e., a signal magnetic field, and the magnetic pinned layer 30 is a layer that a magnetization direction is fixed by the influence of an antiferromagnetic layer 22. In FIG. 1, there is one embodiment shown in which the antiferromagnetic layer 22 is formed on the bottom side (the side of the first shield layer 3); however, it is possible that the antiferromagnetic layer 22 is formed on the top side (the side of the second shield layer 5), so that the free layer 50 and the magnetic pinned layer 30 are interchanged its position.

[Explanation of Main Structure of Invention]

A main part of the present invention is that the spacer layer 40 is configured of a certain three-layer structure with certain materials, and at least one of the first ferromagnetic layer 30 and the second ferromagnetic layer 50 contains a certain amount of an element selected from the group of nitrogen (N), carbon (C), and oxygen (O).

First of all, the first ferromagnetic layer 30 and the second ferromagnetic layer 50 are explained below.

As one embodiment of these magnetic layers, the case where both of the first ferromagnetic layer 30 and the second ferromagnetic layer 50 contain an element selected from the group of nitrogen (N), carbon (C), and oxygen (O) is explained below.

[Explanation of First Ferromagnetic Layer 30]

The first ferromagnetic layer 30 functions as a magnetic pinned layer according to one embodiment of the present invention as shown in FIG. 1. The first ferromagnetic layer 30 is formed on an antiferromagnetic layer 22 having a pinning function through a base layer 21 that is formed on a first shield layer 3. Since the antiferromagnetic layer 22 and the first ferromagnetic layer 30 are exchange-coupled, a unidirectional anisotropy (alternatively, referred to as an exchange bias or coupling magnetic field) is applied to the first ferromagnetic layer 30, and a magnetization direction of the first ferromagnetic layer 30 is fixed. The first ferromagnetic layer 30 is referred to as a magnetic pinned layer or a pinned layer.

The structure of the first ferromagnetic layer 30 (magnetic pinned layer 30) according to one embodiment is configured to be laminated from the antiferromagnetic layer 22 side in the following order: an outer layer 31 (also referred to as an outer pin layer 31); a nonmagnetic intermediate layer 32; and an inner layer 33 (also referred to as an inner pin layer 33). In other words, it forms a so-called a synthetic pinned layer.

The outer layer 31 and the inner layer 33 are made of a ferromagnetic layer that contains ferromagnetic material, such as Co and Fe. The outer layer 31 and the inner layer 33 are antiferromagnetically coupled to each other through the nonmagnetic intermediate layer 22, and their magnetization directions are fixed in an opposite direction relative to each other.

The outer layer 31 and the inner layer 33 are preferably made of, for example, a $CO_{65-70}Fe_{30-35}$ (at %) alloy. It is preferable that a layer thickness of the outer layer 31 is about 2-7 nm, and a layer thickness of the inner layer 33 is about 2-10 nm. The inner layer 33 may also contain a Heusler's alloy layer.

The nonmagnetic intermediate layer 32 is made of a nonmagnetic material that contains at least one element from the group of, for example, Ru, Rh, Ir, Re, Cr, Zr, and Cu. A layer thickness of the nonmagnetic intermediate layer 32 is about 0.35-1.0 nm. The nonmagnetic intermediate layer 32 fixes a magnetization direction of the inner layer 33 and a magnetization direction of the outer layer 31 in directions opposite each other. The phrase, "magnetization in directions opposite each other" means that it covers not only a narrower meaning in which these two magnetization directions are in opposite 180° directions, but also a wider meaning in which these two magnetization directions are in opposite 180° directions±20°.

In the case where an element selected from the group of nitrogen (N), carbon (C), and oxygen (O) mentioned above is added into the first ferromagnetic layer 30 with a three-layer structure, it is necessary to add an element selected from the group of nitrogen (N), carbon (C), and oxygen (O) into the inner layer 33 that is next to the spacer layer 40 to obtain a certain effect of the present invention. If a magnetic layer has a laminated structure, adding a certain element into a layer that is the closest layer to the spacer layer 40 within the laminated magnetic layers is the fundamental rule.

It is preferable that the inner layer 33 is made of CoFe.

If nitrogen (N) is contained in the inner layer 33, the amount of nitrogen (N) is 0.5-14.0 at %. Preferably, it is 1.0-10.0 at %. If the content of nitrogen (N) is lower than 0.5 at %, it is not expected to improve an MR ratio. On the contrary, if the content of nitrogen (N) is too much, i.e., over 14.0 at %, there is a problem that the improved MR ratio is decreased. If the content of an element is too small, the effect of expanding lattice of a magnetic layer by adding an element is small; therefore, the MR ratio is not substantially improved. On the other hand, if the content of an element is excessive, it is understood that it causes a reduction in crystallizability of a magnetic layer and the MR ratio is decreased.

In a method for adding nitrogen (N) into a magnetic layer, a mixture gas of an argon gas and a nitrogen gas is used as a sputtering environment when a magnetic layer is formed by a sputtering method. If the mixture ratio of the nitrogen gas is changed, the content of nitrogen in the magnetic layer is changed.

When carbon (C) is contained in the inner layer 33, the amount of carbon (C) is 0.5-7.0 at %. Preferably, it is 3.0-7.0 at %. If the content of carbon (C) is lower than 0.5 at %, it is not expected to improve an MR ratio. On the contrary, if the content of carbon (C) is too much, i.e., over 7.0 at %, there is a problem that the improved MR ratio is decreased. If the content of an element is too small, the effect of expanding lattice of a magnetic layer by adding an element is small; therefore, the MR ratio is not substantially improved. On the other hand, if the content of an element is excessive, it is understood that it causes a reduction in crystallizability of a magnetic layer and the MR ratio is decreased.

In a method for adding carbon (C) into a magnetic layer, a simultaneous sputtering method, which discharges a target for forming a magnetic layer and a carbon target at the same time, is used. If the charged power is changed, the content of an element is changed. A target that contains carbon (C) in a magnetic material (layer) can be also used.

When oxygen (O) is contained into the inner layer 33, the amount of oxygen (O) is 0.5-10.0 at %. Preferably, it is 1.0-5.0 at %. If the content of oxygen (O) is lower than 0.5 at %, it is not expected to improve an MR ratio. On the contrary, if the content of oxygen (O) is too much, i.e., over 10.0 at %, there is a problem that the improved MR ratio is decreased. If the content of an element is too small, the effect of expanding lattice of a magnetic layer by adding an element is small; therefore, the MR ratio is not substantially improved. On the other hand, if the content of an element is excessive, it is understood that it causes a reduction in crystallizability of a magnetic layer and the MR ratio is decreased.

In a method for adding oxygen (O) into a magnetic layer, a mixture gas of an argon gas and an oxygen gas is used as a sputtering environment when a magnetic layer is formed by a sputtering method. If the mixture ratio of the oxygen gas is changed, the content of oxygen in the magnetic layer is changed.

Although it is speculated, it is understood with respect to the reason why the effect of the present invention, which is improving the MR ratio, is obtained; since a certain element is added into a magnetic layer that is adjacent to the spacer layer 40, the lattice of a magnetic layer is expanded and an inconsistency of the lattice with a zinc oxide (ZnO) semiconductor oxide layer, which is a core of the spacer layer 40, is mitigated; therefore, as the result, the MR ratio is improved.

[Explanation of Second Ferromagnetic Layer 50]

The second ferromagnetic layer 50 functions as a free layer 50. The free layer 50 is a layer in which a magnetization direction is changed according to an external magnetic field and is formed with a ferromagnetic layer having a small coercive force (soft magnetic layer).

A layer thickness of the free layer 50 is, for example, about 2-10 nm. It can be formed with a single layer, and can also be formed with multiple layers of laminated several ferromagnetic layers. The free layer 50 may also contain a Heusler's alloy layer.

As shown in FIG. 1, if it is formed with a single layer, the second ferromagnetic layer 50 is preferably made of CoFe.

If nitrogen (N) is contained into the second ferromagnetic layer 50, the amount of nitrogen (N) is 0.5-14.0 at %. Preferably, it is 1.0-10.0 at %. If the content of nitrogen (N) is lower than 0.5 at %, it is not expected to improve an MR ratio. On the contrary, if the content of nitrogen (N) is too much, i.e., over 14.0 at %, there is a problem that the improved MR ratio is decreased. The method for adding nitrogen (N) into a magnetic layer is described above.

If carbon (C) is contained into the second ferromagnetic layer 50, the amount of carbon (C) is 0.5-7.0 at %. Preferably, it is 3.0-7.0 at %. If the content of carbon (C) is lower than 0.5 at %, it is not expected to improve an MR ratio. On the contrary, if the content of carbon (C) is too much, i.e., over 7.0 at %, there is a problem that the improved MR ratio is decreased. The method for adding carbon (C) into a magnetic layer is described above.

If oxygen (O) is contained into the second ferromagnetic layer 50, the amount of oxygen (O) is 0.5-10.0 at %. Preferably, it is 1.0-5.0 at %. If the content of oxygen (O) is lower than 0.5 at %, it is not expected to improve an MR ratio. On the contrary, if the content of oxygen (O) is too much, i.e., over 10.0 at %, there is a problem that the improved MR ratio is decreased. The method for adding oxygen (O) into a magnetic layer is described above.

If the second ferromagnetic layer 50 has a laminated structure, adding a certain element into a layer that is the closest layer to the spacer layer 40 within the laminated magnetic layers is the fundamental rule.

As shown in FIG. 1, a passivation layer 20, which is made of, for example, Ta layer or Ru layer, is formed on the second ferromagnetic layer 50 (the free layer 50). Its layer thickness is about 0.5-20 nm.

[Explanation of Spacer Layer 40]

The spacer layer 40 according to the present invention is provided that it has a first nonmagnetic metal layer 41, a second nonmagnetic metal layer 43, and a semiconductor oxide layer 42, which is formed between the first and second nonmagnetic metal layers 41, 43.

Specifically, the spacer layer 40 has a three-layer laminated structure that is laminated in the following order: the first nonmagnetic metal layer 41/the semiconductor oxide layer 42/the second nonmagnetic metal layer 43. According to the present embodiment, as shown in FIG. 1, the first nonmagnetic metal layer 41 is located at the area of the first ferromagnetic layer 30 (the magnetic pinned layer 30), and the second nonmagnetic metal layer 43 is located at the area of the second ferromagnetic layer 50 (the free layer 50). A detailed explanation of each element for the structure is given below.

Semiconductor Oxide Layer 42

The semiconductor oxide layer 42 that forms the spacer layer 40 of the present invention is made of zinc oxide (ZnO). A zinc oxide (ZnO) layer is formed, for example, by a sputtering method with a ZnO target. Alternatively, after Zn is formed by sputtering, an oxidization process may be conducted for forming the ZnO layer.

This thin film is usually annealed for 1-10 hours at a temperature of 200-350° C., after the layer is formed. The purposes of this annealing are that a ZnO layer is crystallized and a layer resistance is decreased. The term, an "after the layer is formed" has two meanings; after a semiconductor oxide layer is formed, and after all layers for an entire element are formed. Usually, the annealing process is conducted after all layers for an entire element are formed.

A layer thickness of the semiconductor oxide layer 42 that is made of zinc oxide (ZnO) is 1.0-4.0 nm. Preferably, it is 1.2-2.8 nm. If this thickness is smaller than 1.0 nm, large variations on element characteristics, such as an area resistivity (AR) of an element, likely occur. On the contrary, if this thickness is larger than 4.0 nm, there is a problem that the MR characteristic is deteriorated due to spin scattering. There is also a problem that there is a deviation from the resistance range desired for a CPP-GMR element.

First Nonmagnetic Metal Layer 41 and Second Nonmagnetic Metal Layer 43

The first nonmagnetic metal layer 41 and the second nonmagnetic metal layer 43 are, respectively, made of a metal selected from the group of Cu and Zn.

In the present embodiment shown in FIG. 1, the spacer layer 40 is provided between the first ferromagnetic layer 30 and the second ferromagnetic layer 50 to have the following situation where the first nonmagnetic metal layer 41 abuts the first ferromagnetic layer 30 (the magnetic pinned layer 30), and the second nonmagnetic metal layer 43 abuts the second ferromagnetic layer 50 (the free layer 50). In the present embodiment shown in FIG. 1, the first nonmagnetic metal layer 41, which is located below, is preferably made of Cu, and the second nonmagnetic metal layer 43, which is located above, is preferably made of Zn. A detailed explanation referring to specific experiments is below.

A layer thickness of the first nonmagnetic metal layer 41 is 0.1-1.2 nm. Preferably, it is 0.3-1.0 nm. A layer thickness of the second nonmagnetic metal layer 43 is 0.1-1.2 nm. Preferably, it is 0.3-1.0 nm.

The electric conductivity of the spacer layer 40, which has the structure described above, is preferably in the range of 133-432 S/cm. The electric conductivity of the spacer layer 40 is defined as an inverse of resistivity (Ω·cm) of the spacer layer 40.

[Explanation of Antiferromagnetic Layer 22]

The antiferromagnetic layer 22 functions to fix a magnetization direction of the first ferromagnetic layer 30 (the magnetic pinned layer 30) by exchange-coupling with the first ferromagnetic layer 30 (the magnetic pinned layer 30) described above.

The antiferromagnetic layer 22 is made of antiferromagnetic materials that contain Mn and M', which is at least one element selected from the group of, for example, Pt, Ru, Rh, Pd, Ni, Cu, Ir, Cr, and Fe. It is preferable that the content of Mn is 35-95 at %. The antiferromagnetic material is broken down into two types: (1) a non-heat treatment type antiferromagnetic material that exhibits antiferromagnetism even in the absence of a heat treatment to induce an exchange-coupling magnetic field between it and a ferromagnetic material; and (2) a heat treatment type antiferromagnetic material that exhibits antiferromagnetism by a heat treatment. Usually, the heat treatment is applied to the antiferromagnetic material of the aforementioned type (1), too, so as to put the direction of exchange-coupling in order. In the present invention, both types (1) and (2) may be used. For instance, the non-heat treatment type antiferromagnetic material is exemplified by RuRhMn, FeMn, and IrMn. The heat treatment type antiferromagnetic material is exemplified by PtMn, NiMn, and PtRhMn.

A layer thickness of the antiferromagnetic layer 22 is about 4-30 nm.

For a layer to fix (pin) a magnetization direction of the magnetic pinned layer 30, it is acceptable to provide a hard magnetic layer that is made of a hard magnetic material, such as CoPt, in place of the aforementioned antiferromagnetic layer 22.

The base layer 21 formed below the antiferromagnetic layer 22 is provided to improve the crystallization and orientation of each of the layers laminated on it, and particularly, to improve the exchange-coupling between the antiferromagnetic layer 22 and the magnetic pinned layer 30. For the base layer 21, for instance, a laminated structure of Ta and NiCr layers, or Ta and Ru layers is used. A layer thickness of the base layer 21 is about 2-6 nm as an example.

The area resistivity (AR) of the MR element 8 (CPP-GMR element 8) according to the present invention is in the range of $0.1\text{-}0.3\Omega\cdot\mu m^2$. Preferably, it is $0.12\text{-}0.3\Omega\cdot\mu m^2$. More preferably, it is $0.14\text{-}0.28\Omega\cdot\mu m^2$. If the AR is out of the range of $0.1\text{-}0.3\Omega\cdot\mu m^2$, it is difficult to obtain a large MR ratio while controlling noise and influence of spin torque.

The element (CPP-GMR element) to be measured its area resistivity is a laminated structure having the base layer 21, the antiferromagnetic layer 22, the first ferromagnetic layer 30, the spacer layer 40, the second ferromagnetic layer 50, and the passivation layer 20, as shown in FIG. 1.

The insulating layer 4 shown in FIG. 1, for instance, is made of alumina. The bias magnetic field application layer 6, for instance, is made of a hard magnetic layer (hard magnet), or a laminated structure of a ferromagnetic layer and antiferromagnetic layer, specifically exemplified by CoPt or CoCrPt.

The CPP-GMR element according to one embodiment of the present invention is formed by a vacuum layer forming method, such as a sputtering method. If necessary, after a layer is formed, an annealing process is provided.

The MR element according to the present invention is in no sense limited to the type and structure of the element that has been explained so far in detail, so long as the state of two magnetic layers functioning as sensors changes relatively in response to an external magnetic field. For instance, the fabrication process for, and the structure of, the present invention is applied the structure where two free layers sandwich a spacer layer.

[Explanation of Overall Structure of Thin Film Magnetic Head]

FIG. 2 shows a sectional view (i.e., a cross section taken through the Y-Z plane) of a thin film magnetic head in parallel with the so-called air bearing surface (ABS).

A thin film magnetic head 100 as shown in FIG. 2 is mounted on a magnetic recording device such as a hard disk drive in order to magnetically process a recording medium 10 such as a hard disk that moves in the medium traveling direction M.

The thin film magnetic head 100 as exemplified in the drawing is a so-called complex type head that is executable for both recording processing and reading processing as magnetic processing. As shown in FIG. 2, it has a structure of a magnetic head part 101 formed on a slider substrate 1 structured of ceramic material such as ALTIC ($Al_2O_3$.TiC).

A magnetic head part 101 has a laminated constitution of a reading head part 100A for reading magnetic information recorded using the MR effect and, for example, a shield type recording head part 100B for executing the recording processing of the perpendicular recording system.

A description is given below in more detail.

A first shield layer 3 and a second shield layer 5 are flat layers formed in a manner of being substantially parallel to the side surface 1$a$ of the slider substrate 1. These layers 3 and 5 form a part of the ABS that is the medium opposite surface 70.

An MR effect part 8 is sandwiched between the first shield layer 3 and the second shield layer 5 and forms part of the medium opposite surface 70. A height perpendicular to the medium opposite surface 70 (i.e., in the Y direction) is an MR height (MR-h).

The first shield layer 3 and the second shield layer 5 are formed by a pattern plating method including a frame plating method, for example. Although it is not clearly shown in the drawing, the first shield layer 3 and the second shield layer 5 need to be structured in such a way as to demonstrate the above-mentioned effect of the present invention.

The MR effect part 8 is a laminated layer substantially parallel to the side surface 1$a$ of the slider substrate 1, and forms a part of the medium opposite surface 70.

The MR effect part 8 is a film surface perpendicular type (or current perpendicular to plane: CPP) laminated film in which a sense current flows in the direction perpendicular to the laminating surface and has a constitution as described above.

Moreover, as shown in FIG. 2, an interelement shield layer 9 made of the same material as that of the second shield layer 5 is formed between the second shield layer 5 and the recording head part 100B.

The interelement layer 9 functions in a manner of shielding the MR element 8 that functions as a sensor from a magnetic field generated by the recording head part 100B, thereby blocking exogenous noises at the time of reading. A bucking coil part may also be formed between the interelement layer 9 and the recording head part 100B. The bucking coil part is to generate magnetic flux that overrides a magnetic flux loop that is generated by the recording head part 100B and passes through the upper and lower electrode layers of the MR element 8 and, therefore, acts in a manner of suppressing unnecessary writing to a magnetic disk or wide area adjacent tracks erasing (WATE) phenomena that are erasing operations.

Insulating layers 4 and 44 made of alumina, etc. are formed as follows:

i) in a gap between the first shield layer 3 and the second shield layer 5 on the side opposite to the medium opposite surface 70 of the MR element 8;

ii) in a rear (posterior) region between the first and second shield layers 3 and 5 and the interelement shield layer 9, the rear region being on the side opposite to the medium opposite surface 70;

iii) in a gap between the first shield layer 3 and the slider substrate 1; and iv) in a gap between the interelement shield layer 9 and the recording head part 100B.

The recording head part 100B is preferably structured for perpendicular magnetic recording and, as shown in FIG. 2, has a main magnetic pole layer 15, a gap layer 18, a coil insulating layer 26, a coil layer 23 and an auxiliary magnetic pole layer 25.

The main magnetic pole layer 15 is structured to be a leading magnetic path for leading and focusing magnetic flux initiated by the coil layer 23 to the recording layer of a magnetic recording medium 10 to be written. It is preferred that the end part of the main magnetic pole layer 15 on the side of the medium opposite surface 70 should be smaller in thickness compared with other portions in the track width direction (i.e., the direction along the X-axis in FIG. 2) and in the laminating direction (i.e., the direction along the Z-axis in FIG. 2). As a result, it is possible to generate a magnetic field for minute and strong writing corresponding to high recording density.

On the end part of the auxiliary magnetic pole layer 25 magnetically coupled with the main magnetic pole layer 15 on the side of the medium opposite surface 70 is formed a trailing shield part that has a wider layer cross section than the other portions of the auxiliary magnetic layer 25. As shown in FIG. 2, the auxiliary magnetic pole layer 25 is disposed in a manner of being opposed to the end part of the main magnetic pole layer 15 on the side of the medium opposite surface 70 via the gap layer 18 made of insulating material such as alumina and the coil insulating layer 26.

The provision of the auxiliary magnetic pole layer 25 enables formation of a steep magnetic field gradient between the auxiliary magnetic pole layer 25 and the main magnetic pole layer 15 in the vicinity of the medium opposite surface 70. As a result, jitter is reduced in a signal output, thereby making the error rate smaller at the time of reading.

The auxiliary magnetic pole layer 25 is formed for example, to about 0.5-5 μm in thickness by a frame plating method, a sputtering method or the like. The material may be an alloy made of two or three elements selected from the group consisting of Ni, Fe and Co, for example, or an alloy made of these elements, as main components, along with predetermined chemical elements.

The gap layer 18 is formed to separate the coil layer 23 from the main magnetic pole layer 15. The gap layer 18 may be formed by a sputtering method, a CVD method or the like, for example, have a thickness of about 0.01-0.5 μm and be structured of $Al_2O_3$, diamond-like carbon (DLC) or the like.

[Explanation of Function of Thin Film Magnetic Head]

The function of a thin film magnetic head according to the present embodiment is given below. The thin film magnetic head has a function that a recording head writes information on a recording medium, and a reading head reads recorded information on the recording medium.

In the reading head, a direction of a bias magnetic field of the bias magnetic field application layer 6 is an X direction that is orthogonal to the perpendicular direction to the medium opposite surface 70. In the CPP-GMR element 8, a magnetization direction of the second ferromagnetic layer 50 (the free layer 50) is equal to a direction (X direction) of the bias magnetic field under the situation that there is not a signal magnetic field. A magnetization direction of the first ferromagnetic layer 30 (the magnetic pinned layer 30) is fixed to a direction (a Y direction) that is perpendicular to the medium opposite surface 70.

In the CPP-GMR element 8, a magnetization direction of the second ferromagnetic layer 50 (the free layer 50) is changed based on a signal magnetic field from a recording medium, then a relative degree between the magnetization direction of the second ferromagnetic layer 50 (the free layer) and a magnetization direction of the first ferromagnetic layer 30 (the magnetic pinned layer 30) is changed, and as a result, the resistance of the CPP-GMR element 8 is changed. The resistance of the CPP-GMR element 8 is obtained through an electric potential difference between two electrodes 3 and 5 when a sense current flows in the MR element by the first and second shield layers 3 and 5. As described above, the reading head is able to read recorded information on the recording medium.

[Explanation of Head Gimbal Assembly and Hard Disk Device]

Next, a head gimbal assembly on which the above mentioned thin film head is mounted and one embodiment of a hard disk device are described below.

First, a description of a slider 210 equipped with the head gimbal assembly is illustrated in FIG. 3. In the hard disk device, the slider 210 is disposed in a manner of being opposed to a hard disk that is a rotatably driven disk-like recording medium. The slider 210 is provided with a base substrate 211 mainly configured of a substrate and an overcoat.

The base substrate 211 is substantially hexahedronal. Of the six surfaces of the base substrate 211, one surface is disposed in a manner of being opposed to a hard disk. The medium opposite surface 70 is formed on the surface.

When a hard disk is rotated in the Z direction in FIG. 3, an airflow passing between the hard disk and the slider 210 creates lifting power downwardly in the Y direction in FIG. 3. The slider 210 floats from the surface of the hard disk by this lifting power. The X direction in FIG. 3 is the track traversing direction of the hard disk.

In the vicinity of the end part of the slider 210 on the air exit side (i.e., the end part on the lower left in FIG. 3), the thin film magnetic head according to the present embodiment is formed.

Next, a description of the head gimbal assembly 220 according to the present embodiment is described by referring to FIG. 4. The head gimbal assembly 220 is provided with the slider 210 and a suspension 221 for elastically supporting the slider 210. The suspension 221 has a plate spring load beam 222 formed of stainless steel, a flexure 223 that is provided on one end part of the load beam 222 and joined with the slider 210 in a manner of giving the slider 210 a proper degree of freedom, and a base plate 224 provided on the other end part of the load beam 222.

The base plate 224 is mounted on an arm 230 of an actuator for moving the slider 210 in the track traversing direction X of the hard disk 262. The actuator has the arm 230 and a voice coil motor for driving the arm 230. A gimbal part is provided for keeping a posture of the slider 210 constant on the portion of the flexure 223 on which the slider 210 is mounted.

The head gimbal assembly 220 is mounted on the arm 230 of the actuator. One arm 230 with a head gimbal assembly 220 mounted thereon is called a head arm assembly. A carriage having multiple arms, each of which has a head gimbal assembly mounted thereon, is referred as a head stack assembly.

FIG. 4 shows one embodiment of a head arm assembly. In this head arm assembly, a head gimbal assembly 220 is mounted on one end part of the arm 230. A coil 231, part of a voice coil motor, is mounted on the other end part of the arm 230. A bearing part 233 is provided in the middle part of the arm 230 so that a shaft 234 is rotatably supported.

A description of one example of the head stack assembly and the hard disk device according to the present embodiment is described by referring to FIG. 5 and FIG. 6.

FIG. 5 is an explanatory view illustrating the main part of a hard disk device. FIG. 6 is a plan view of the hard disk device.

The head stack assembly 250 has a carriage 251 having multiple arms 252. On the multiple arms 252 are mounted multiple head gimbal assemblies 220 in the perpendicular direction at certain intervals. A coil 253, part of a voice coil motor, is mounted on the opposite side of the arms 252 in the carriage 251. The head stack assembly 250 is incorporated into a hard disk device.

A hard disk device has multiple hard disks 262 mounted on a spindle motor 261. Two sliders 210 are disposed for each hard disk 262 in a manner of being opposed to each other by sandwiching the hard disk 262. The voice coil motor has permanent magnets 263 disposed in a manner of being opposed to each other by sandwiching the coil 253 of the head stack assembly 250.

The head stack assembly 250 and an actuator except for sliders 210 support as well as locate the slider 210 relative to the hard disk 22 corresponding to a positioning device of the present invention.

In the hard disk device according to the present embodiment, an actuator allows moving sliders 210 in the track traversing direction of the hard disk 262 in order to position sliders 210 relative to the hard disk 262. Thin film magnetic heads included in sliders 210 record information on the hard disk 262 by the recording head and reproduce (or read) information recorded in the hard disk 262 by the reading head.

The head gimbal assembly and hard disk device according to the present embodiment are as effective as the thin film magnetic head according to the above-mentioned embodiment.

In the embodiment, it is explained that a thin film magnetic head has a structure of a reading head part formed on the base substrate side and a perpendicular recording head part layered thereon. However, the layering order may be reversed. Moreover, the configuration may be such that only a reading part is provided in the case of a reproduction-only thin film head.

Since the configuration of a recording head is not limited, a perpendicular magnetic recording head is applicable as well. For example, the perpendicular magnetic recording head structure shown in Japanese laid open patent application JP2006-155866 is applicable.

EXEMPLARY EMBODIMENTS OF SPECIFIC EXPERIMENTS

A detail description of the CPP-GMR element described above according to the present invention is given below with reference to specific experiments.

Experiment I

As shown in Tables 1 and 2, CPP-GMR element samples with a laminated structure according to the present invention, and comparison CPP-GMR element samples with a laminated structure, are respectively formed by a sputtering method.

The detailed structures of the first ferromagnetic layer 30 and the second ferromagnetic layer 50 for the present invention samples and comparison samples are referred to in Table 2 below.

CoPt is used for the bias magnetic field application layer 6.

A ZnO layer as the semiconductor oxide layer 42 contained in the spacer layer 40 is formed by a sputtering method with a ZnO target. After each layer configured as an element is formed, the ZnO layer is crystallized and has low resistance as the result of an annealing process at a temperature of 250° C. and for three hours.

TABLE 1

| Laminated Structure | | Layer Material | Layer Thickness (nm) |
|---|---|---|---|
| Passivation Layer | | Ru | 10.0 |
| Second Ferromagnetic Layer (50) (Free Layer (50)) | | <See Table 2> | 4.0 |
| Spacer Layer (40) | Second Nonmagnetic Metal layer (43) | Zn | 0.7 |
| | Semiconductor Oxide Layer (42) | ZnO | 1.7 |
| | First Nonmagnetic Metal Layer (41) | Cu | 0.7 |
| First Ferromagnetic Layer (30) (Magnetic Pinned Layer (30)) | Inner layer (33) | <See Table 2> | 3.5 |
| | Nonmagnetic Intermediate Layer (32) | Ru | 0.8 |
| | Outer Layer (31) | $Co_{70}Fe_{30}$ | 3.0 |
| Antiferromagnetic Layer (22) | | IrMn | 5.0 |
| Base Layer (21) | | Ru | 2.0 |
| | | Ta | 1.0 |

When specific some samples are formed as shown in Table 2, an appropriate element selected from the group of nitrogen (N), carbon (C), and oxygen (O) is contained into the inner layer 33 of the first ferromagnetic layer 30, and into the second ferromagnetic layer 50 shown in Table 1.

A method for adding nitrogen (N) into a magnetic layer is provided in which a mixture gas of an argon gas and a nitrogen gas is used as a sputtering environment when a magnetic layer is formed by a sputtering method. If the mixture ratio of nitrogen gas is changed, the content of nitrogen in a magnetic layer is changed.

A method for adding carbon (C) into a magnetic layer is provided in which a simultaneous sputtering method, which discharges a target for forming a magnetic layer and a carbon target at the same time, is used. If the charged power is changed, the content of an element is changed.

A laminated layer, which configures a main part of an element, is processed into a column-like shape of 200×200 nm, and then the side portion of the processed laminated layer is covered by an insulating layer of $Al_2O_3$ with a layer thickness of 30 nm. Finally, by forming an electrode on the top portion of the processed laminated layer, CPP-GMR element samples are completely formed.

With respect to each of these CPP-GMR element samples, (1) an MR ratio, and (2) an Area Resistivity AR ($\Omega \cdot \mu m^2$) are measured with in the manner described below and evaluated, respectively.

(1) MR Ratio

An MR ratio is measured by a DC four-probe method. An applied external magnetic field is 3,000 Oe. The MR ratio is calculated through dividing "a variation of a resistance $\Delta R$" by "a resistance R," and it represents as $\Delta R/R$. Because the numeric value of the MR ratio is small, they are shown in percentage terms.

It is noted that the MR ratio is calculated through an average of 100 samples' MR ratios.

(2) Area Resistivity AR of Element

An Area Resistivity AR of an element is measured by a DC four-probe method.

The results are shown in Table 2 below.

In conducted experiments shown in Table 2, a Co/Fe atom ratio in a inner layer 33 is configured as Co/Fe=50/50, and a Co/Fe atom ratio in a second free layer 50 (a free layer) is configured as Co/Fe=70/30.

It is clear that the present invention has the desired effect as shown in the above experimental results of Table 2.

An MR element according to the present invention further improves an MR ratio because a structure of a spacer layer 40 is configured of a certain three-layer structure with certain materials, and at least one of a first ferromagnetic layer 30 and a second ferromagnetic layer contains a certain amount of an element selected from the group of nitrogen (N), carbon (C), and oxygen (O).

Reference Experiment I

A reference experiment in which a spacer layer is made of aluminum oxide is shown below.

A TMR (Tunnel type Magneto-Resistive effect) element in which a spacer layer is made of aluminum is formed. The TMR element has a laminated structure as shown in Tables 3 and 4 below. A reference experiment is conducted for the TMR element under the following condition: in the TMR element, at least one of a first ferromagnetic layer 30 and a second ferromagnetic layer contains a certain amount of carbon (C).

With respect to a method for making aluminum oxide, after an aluminum layer is formed by a DC sputtering method, the

TABLE 2

| Sample No. | Inner Layer (33) (First Ferromagnetic Layer (30)) | | | Second Ferromagnetic Layer (50) (Free Layer) | | | MR Ratio (%) | Area Resistivity AR ($\Omega \cdot \mu m^2$) |
|---|---|---|---|---|---|---|---|---|
| | Material Composition | Added Element | Added Amount (at %) | Material Composition | Added Element | Added Amount (at %) | | |
| Comparison I-1 | CoFeN | — | — | CoFe | — | — | 16.3 | 0.22 |
| Experiment I-1 | CoFeN | N | 0.5 | CoFe | — | — | 16.9 | 0.23 |
| Experiment I-2 | CoFeN | N | 1.0 | CoFe | — | — | 17.6 | 0.23 |
| Experiment I-3 | CoFeN | N | 3.0 | CoFe | — | — | 18.3 | 0.24 |
| Experiment I-4 | CoFeN | N | 5.0 | CoFe | — | — | 18.7 | 0.24 |
| Experiment I-5 | CoFeN | N | 10.0 | CoFe | — | — | 18.5 | 0.24 |
| Experiment I-6 | CoFeN | N | 14.0 | CoFe | — | — | 16.7 | 0.26 |
| Experiment I-7 | CoFeC | C | 0.5 | CoFe | — | — | 16.5 | 0.22 |
| Experiment I-8 | CoFeC | C | 1.0 | CoFe | — | — | 16.7 | 0.22 |
| Experiment I-9 | CoFeC | C | 3.0 | CoFe | — | — | 17.0 | 0.22 |
| Experiment I-10 | CoFeC | C | 5.0 | CoFe | — | — | 17.4 | 0.23 |
| Experiment I-11 | CoFeC | C | 7.0 | CoFe | — | — | 16.9 | 0.23 |
| Experiment I-12 | CoFeC | C | 10.0 | CoFe | — | — | 15.3 | 0.23 |
| Experiment I-13 | CoFeC | C | 14.0 | CoFe | — | — | 12.4 | 0.24 |
| Experiment I-14 | CoFeO | O | 0.5 | CoFe | — | — | 16.9 | 0.23 |
| Experiment I-15 | CoFeO | O | 1.0 | CoFe | — | — | 17.8 | 0.24 |
| Experiment I-16 | CoFeO | O | 3.0 | CoFe | — | — | 18.0 | 0.24 |
| Experiment I-17 | CoFeO | O | 5.0 | CoFe | — | — | 18.2 | 0.25 |
| Experiment I-18 | CoFeO | O | 10.0 | CoFe | — | — | 17.1 | 0.27 |
| Experiment I-19 | CoFeO | O | 14.0 | CoFe | — | — | 13.5 | 0.30 |
| Experiment I-20 | CoFe | — | — | CoFeN | N | 1.0 | 17.0 | 0.23 |
| Experiment I-21 | CoFe | — | — | CoFeN | N | 5.0 | 18.2 | 0.24 |
| Experiment I-22 | CoFe | — | — | CoFeC | C | 3.0 | 16.6 | 0.23 |
| Experiment I-23 | CoFe | — | — | CoFeC | C | 5.0 | 16.9 | 0.23 |
| Experiment I-24 | CoFe | — | — | CoFeO | O | 3.0 | 17.5 | 0.25 |
| Experiment I-25 | CoFe | — | — | CoFeO | O | 5.0 | 17.8 | 0.25 |
| Experiment I-26 | CoFeN | N | 1.0 | CoFeN | N | 1.0 | 17.7 | 0.24 |
| Experiment I-27 | CoFeN | N | 5.0 | CoFeN | N | 5.0 | 18.9 | 0.26 |
| Experiment I-28 | CoFeC | C | 3.0 | CoFeC | C | 3.0 | 17.2 | 0.23 |
| Experiment I-29 | CoFeC | C | 5.0 | CoFeC | C | 5.0 | 17.5 | 0.24 |
| Experiment I-30 | CoFeO | O | 3.0 | CoFeO | O | 3.0 | 18.1 | 0.25 |
| Experiment I-31 | CoFeO | O | 5.0 | CoFeO | O | 5.0 | 18.4 | 0.26 | aluminum layer is exposed to an oxygen atmosphere of one Pascal (1 Pa), so that an AlOx barrier layer is formed.

The detailed structures of a first ferromagnetic layer 30 and a second ferromagnetic layer 50 are referred to Table 4 below. A method for adding carbon (C) into an inner layer 33 of a first ferromagnetic layer 30 is conducted by the method described above.

TABLE 3

| Laminated Structure | | Layer Material | Thickness (nm) |
|---|---|---|---|
| Passivation Layer | | Ru | 10.0 |
| Second Ferromagnetic Layer (50) (Free Layer (50)) | | <See Table 4 below> | 4.0 |
| Spacer Layer (40) | | AlOx | 0.5 |
| First Ferromagnetic Layer (30) (Magnetic Pinned Layer (30)) | Inner Layer (33) | <See Table 4 below> | 3.5 |
| | Nonmagnetic Intermediate Layer (32) | Ru | 0.8 |
| | Outer Layer (31) | $Co_{70}Fe_{30}$ | 3.0 |
| Antiferromagnetic Layer (22) | | IrMn | 5.0 |
| Base Layer (21) | | Ru | 2.0 |
| | | Ta | 1.0 |

TABLE 4

| | Inner Layer (33) (First Ferromagnetic Layer (30)) | | | Second Ferromagnetic Layer (50) (Free Layer) | | | | |
|---|---|---|---|---|---|---|---|---|
| Sample No. | Material Composition | Added Element | Added Amount (at %) | Material Composition | Added Element | Added Amount (at %) | MR ratio (%) | AR ($\Omega \cdot \mu m^2$) |
| Reference II-1 | CoFe | — | — | CoFe | — | — | 41.0 | 4.0 |
| Reference II-2 | CoFeC | C | 5.0 | CoFe | — | — | 40.9 | 4.1 |

As the reference experiment results shown in Table 4 above, it is understood that even though a certain amount of carbon (C) is added into at least one of a first ferromagnetic layer 30 and a second ferromagnetic layer 50, an MR ratio of a TMR element, which includes an aluminum oxide barrier layer as a spacer layer, is not improved. It appears like that one of factors for the results is that the spacer layer 40 made of aluminum oxide is not crystalline, and is noncrystalline.

It is clear that the present invention has the desired effect as shown in the above experimental results.

In conclusion, an MR element according to the present invention has the superior effects that further improve an MR ratio because a structure of a spacer layer 40 is configured of a certain three-layer structure with certain materials, and at least one of a first ferromagnetic layer 30 and a second ferromagnetic layer 50 contains a certain amount of an element selected from the group of nitrogen (N), carbon (C), and oxygen (O).

With respect to possibilities of the industrial use of the present invention, it is used in a magnetic disk device with an MR element that detects a magnetic field intensity as a signal from a magnetic recording medium, and so on.

What is claimed is:

1. A magnetoresistive effect (MR) element in a current perpendicular to plane type (CPP-type) structure comprising:
a spacer layer; and
a first ferromagnetic layer and a second ferromagnetic layer laminated to each other to sandwich the spacer layer, and a sense current flows in the laminated direction, wherein
the spacer layer comprises a first nonmagnetic metal layer and a second nonmagnetic metal layer that both are made of a nonmagnetic metal material, and a semiconductor oxide layer formed between the first nonmagnetic metal layer and the second nonmagnetic metal layer,
the semiconductor oxide layer is made of zinc oxide (ZnO),
one of the first nonmagnetic metal layer and the second nonmagnetic metal layer is made of Cu, and the other of the first nonmagnetic metal layer and the second nonmagnetic metal layer is substantially made of Zn,
at least one of the first ferromagnetic layer and the second ferromagnetic layer contains an element selected from the group of nitrogen (N), carbon (C), and oxygen (O), and
electric conductivity of the spacer layer is in a range of 133-432 S/cm.

2. The MR element in the CPP-type structure according to claim 1, wherein at least one of the first ferromagnetic layer and the second ferromagnetic layer contains 0.5-14.0 at % of nitrogen (N).

3. The MR element in the CPP-type structure according to claim 1, wherein at least one of the first ferromagnetic layer and the second ferromagnetic layer contains 0.5-7.0 at % of carbon (C).

4. The MR element in the CPP-type structure according to claim 1, wherein at least one of the first ferromagnetic layer and the second ferromagnetic layer contains 0.5-10.0 at % of oxygen (O).

5. The MR element in the CPP-type structure according to claim 1, wherein the semiconductor oxide layer is made of zinc oxide (ZnO),
the first nonmagnetic metal layer is made of Cu, and the second nonmagnetic metal layer is made of Zn and is located above the first nonmagnetic metal layer.

6. The MR element in the CPP-type structure according to claim 1, wherein the first ferromagnetic layer and the second ferromagnetic layer are made of CoFe, and one of these layers contains an element selected from the group of nitrogen (N), carbon (C), and oxygen (O).

7. The MR element in the CPP-type structure according to claim 1, wherein magnetic layers abut the spacer layer and form a part of the first ferromagnetic layer and the second ferromagnetic layer, respectively, the magnetic layers being made of CoFe, and one of the magnetic layers containing an element selected from the group of nitrogen (N), carbon (C), and oxygen (O).

8. The MR element in the CPP-type structure according to claim 1, wherein the first ferromagnetic layer is a magnetic pinned layer, and the second ferromagnetic layer is a free layer.

9. The MR element in CPP-type structure according to claim 1, wherein both the first ferromagnetic layer and the second ferromagnetic layer are free layers.

10. The magnetoresistive effect element in CPP-type structure according to claim 1, wherein a layer thickness of the first nonmagnetic metal layer is 0.1-1.2 nm, a layer thickness of the second nonmagnetic metal layer is 0.1-1.2 nm, and a layer thickness of the semiconductor oxide layer is 1.0-4.0 nm.

11. The magnetoresistive effect element in CPP-type structure according to claim 1, wherein the area resistivity of the MR element is $0.1$-$0.3 \Omega \cdot \mu m^2$.

12. A thin film magnetic head comprising:
an air bearing surface (ABS) that is opposite to a recording medium;
the magnetoresistive effect element according to claim 1 that is provided in the vicinity of the ABS to detect a signal magnetic field from the recording medium; and
a pair of electrodes that apply an electric current in a laminated direction of the MR element.

13. A head gimbal assembly comprising:
a slider having the thin film magnetic head according to claim 12 and being provided opposite to a recording medium; and
a suspension elastically supporting the slider.

14. A magnetic disk device comprising:
a slider having the thin film magnetic head according to claim 12 and being provided opposite to a recording medium; and
a positioning device supporting the slider and locating a position of the slider with respect to the recording medium.

* * * * *